(12) United States Patent
Ahn et al.

(10) Patent No.: US 7,579,236 B2
(45) Date of Patent: Aug. 25, 2009

(54) NONVOLATILE MEMORY DEVICE, METHOD OF FABRICATING AND METHOD OF OPERATING THE SAME

(75) Inventors: Jong-hyon Ahn, Suwon-si (KR); Jin-woo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/589,725

(22) Filed: Oct. 31, 2006

(65) Prior Publication Data

US 2008/0087934 A1    Apr. 17, 2008

(30) Foreign Application Priority Data

Oct. 12, 2006    (KR) ................ 10-2006-0099523

(51) Int. Cl.
    *H01L 21/336*    (2006.01)
(52) U.S. Cl. ................ 438/257; 438/267; 257/E23.147
(58) Field of Classification Search ................ 438/257, 438/266, 267, 123; 257/E23.147
    See application file for complete search history.

(56) References Cited

U.S. PATENT DOCUMENTS

| 6,876,032 B2 * | 4/2005 | Hsieh ................ 257/315 |
| 2004/0084713 A1 * | 5/2004 | Hsieh ................ 257/315 |
| 2006/0267075 A1 * | 11/2006 | Sandhu et al. ............. 257/316 |
| 2007/0243681 A1 * | 10/2007 | Kim ........................ 438/258 |

FOREIGN PATENT DOCUMENTS

| JP | 2005-064503 | 3/2005 |
| JP | 2006-066695 | 3/2006 |
| JP | 2006-066702 | 3/2006 |
| KR | 10-2000-0053585 A | 8/2000 |
| KR | 10-2002-0096610 A | 12/2002 |
| KR | 10-2005-0017121 A | 2/2005 |
| KR | 1020050034010 A | 4/2005 |
| KR | 10-2005-0069188 A | 7/2005 |
| KR | 1020050069188 A | 7/2005 |

OTHER PUBLICATIONS

Korean Office Action dated Sep. 21, 2007.
Korean Notice of Allowance dated Mar. 11, 2008.

* cited by examiner

*Primary Examiner*—David S Blum
(74) *Attorney, Agent, or Firm*—Harness, Dickey & Pierce P.L.C.

(57) ABSTRACT

A nonvolatile memory device may include a semiconductor substrate; first and second floating gate electrodes formed on the semiconductor substrate; a control gate electrode formed on the first and second floating gate electrodes that may include a line body and a first leg, second leg, and third leg extending vertically from the line body toward the semiconductor substrate; and an inter-layer insulating film interposed between the semiconductor substrate and a lower end of the first leg and between the semiconductor substrate and a lower end of the second leg.

14 Claims, 13 Drawing Sheets

NONVOLATILE MEMORY DEVICE, METHOD OF FABRICATING AND METHOD OF OPERATING THE SAME

PRIORITY STATEMENT

This U.S. non-provisional application claims benefit of priority under 35 U.S.C. §119 from Korean Patent Application No. 10-2006-099523, filed on Oct. 12, 2006 in the Korean Intellectual Property Office (KIPO), the disclosure of which is incorporated herein by reference in its entirety.

BACKGROUND

1. Field

Example embodiments relate to a nonvolatile memory device, a method of fabricating and a method of operating the same. For example, a nonvolatile flash memory device may have improved reliability and/or may secure an increased opposing area between control gate and floating gate electrodes, a method of fabricating and method of operating the nonvolatile flash memory device.

2. Description of the Related Art

Memory devices may have various applications in various apparatuses, for example, micro-controllers and credit cards. Memory devices may be classified into volatile memory devices and nonvolatile memory devices. Volatile memory devices may include dynamic random access memories (DRAMs) and static random access memories (SRAMs). The volatile memory devices may input and output data at higher speed, however, data in the volatile memory devices may disappear over time. On the other hand, non-volatile memory devices may permanently retain data, however, non-volatile memory devices may input and output data at lower speed. For example, flash memories and electrically erasable and programmable read-only memories (EEPROMs), which may electrically input and output data, have been developed as non-volatile memory devices.

Memory devices may increasingly be required to be more highly integrated, and a structure for programming multi-bit data in a cell may be developing.

As memory devices may become smaller with decreasing design rules, even a slight misalignment of floating gate electrodes or control gate electrodes may significantly deteriorate the performance of the memory devices, thereby undermining the reliability of the memory devices. In addition, because a smaller memory device may result in a smaller opposing area between control gate and floating gate electrodes, it may be difficult to secure sufficiently large capacitance between the control gate and floating gate electrodes. Therefore, a driving voltage may be increased.

SUMMARY

Example embodiments may provide a nonvolatile memory device that may have improved reliability and may secure an increased opposing area between a control gate electrode and floating gate electrodes.

Example embodiments may provide a method of fabricating a nonvolatile memory device that may have improved reliability and may secure an increased opposing area between a control gate electrode and floating gate electrodes.

Example embodiments may provide a method of operating a nonvolatile memory device that may have improved reliability and may secure an increased opposing area between a control gate electrode and floating gate electrodes In an example embodiment, a nonvolatile memory device may include a semiconductor substrate; first and second floating gate electrodes formed on the semiconductor substrate; a control gate electrode formed on the first and second floating gate electrodes and that may include a line body and a first leg, second leg, and third leg extending vertically from the line body toward the semiconductor substrate; and an inter-layer insulating film interposed between the semiconductor substrate and a lower end of the first leg and between the semiconductor substrate and a lower end of the second leg.

In an example embodiment, a method of fabricating a nonvolatile memory device may include forming a first insulating film having an opening on a semiconductor substrate; forming first and second floating gate electrodes on inner side walls of the first insulating film on the sides of the opening; etching the first insulating film to partially expose outer side surfaces of the first and second floating gate electrodes; and forming a control gate electrode on the first and second floating gate electrodes, the control gate electrode including a line body and a first leg, second leg, and third leg extending vertically from the line body toward the semiconductor substrate.

In an example embodiment, a method of operating a nonvolatile memory device may include applying a voltage to a control gate electrode including a line body and a first leg, a second leg, and a third leg extending vertically from the line body toward the semiconductor substrate; and applying voltages to impurity doped regions that may be disposed on the semiconductor substrate beyond the outer side surfaces of a first and second floating gate electrode. The voltage applied to the control gate electrode may be above a threshold level.

BRIEF DESCRIPTION OF THE DRAWINGS

Example embodiments will be more clearly understood with reference to the accompanying drawings.

DESCRIPTION OF EXAMPLE EMBODIMENTS

Figure 1:
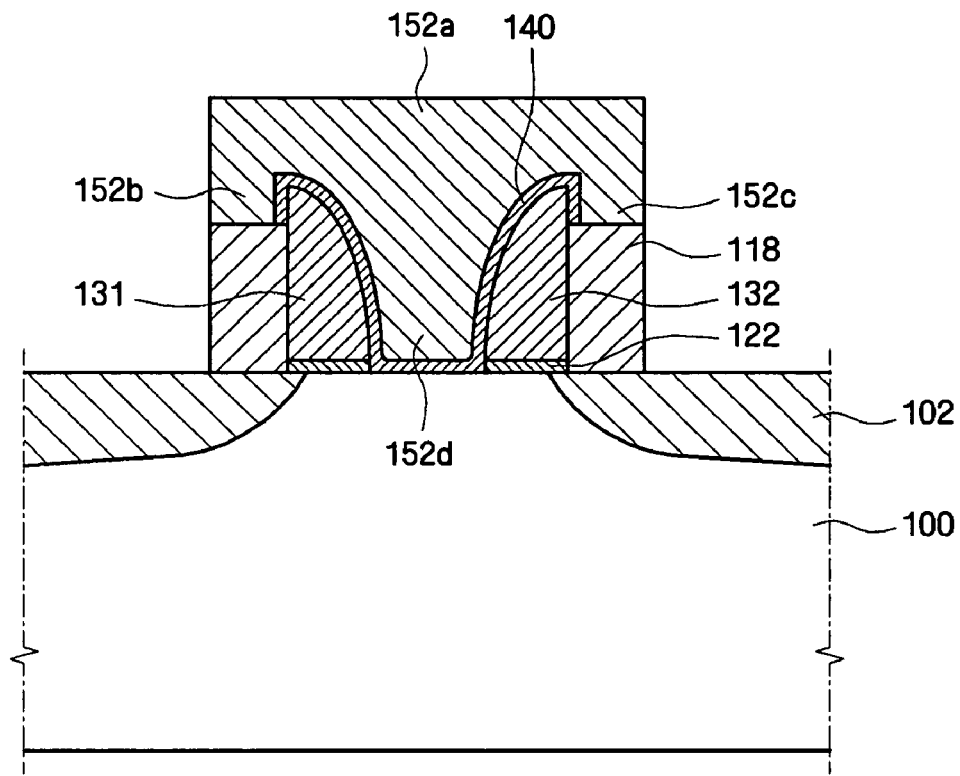
FIG. 1 is a cross-sectional view of a nonvolatile memory device according to an example embodiment.

Example embodiments will now be described more fully with reference to the accompanying drawings. Example embodiments may, however, be embodied in many different forms and should not be construed as being limited to the example embodiments set forth herein. Rather, these example embodiments are provided so that this disclosure will be thorough and to convey the scope to those skilled in the art.

In some example embodiments, well-known processing processes, well-known structures and well-known technologies will not be specifically described in order to avoid ambiguous interpretation of the example embodiments.

In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term 'inner side' as used herein may refer to a direction close to the center of a cell of a nonvolatile memory device with respect to a central axis of the cell, and the term 'outer side' may refer to a direction further from the center of the cell with respect to the center axis of the nonvolatile memory device.

A nonvolatile memory device according to example embodiments will hereinafter be described in detail with reference to the accompanying drawings. A NOR flash memory device will be used in the example embodiments of the nonvolatile memory device. However, the example embodiments are not limited thereto. For example, NAND flash memory devices or electrically erasable and programmable read-only memories (EEPROMs) may also be used in example embodiments.

FIG. 1 is a cross-sectional view of a nonvolatile memory device according to an example embodiment.

Referring to FIG. 1, the nonvolatile memory device may include first and second floating gate electrodes 131 and 132 that may be formed on a semiconductor substrate 100. A control gate electrode 152 may be formed contacting the first and second floating gate electrodes 131 and 132.

For example, the semiconductor substrate 100 may be formed of at least one of Si, Ge, SiGe, GaP, GaAs, SiC, SiGeC, InAs and InP. The semiconductor substrate 100 maybe a P-type substrate or an N-type substrate. Although not shown, the semiconductor substrate 100 may include a P-type well doped with p-type impurities or an N-type well doped with n-type impurities.

Source/drain regions 102 may be formed in the semiconductor substrate 100 and may be spaced apart from each other. The source/drain regions 102 may be doped with p-type or n-type impurities, and a channel region may be formed between a pair of source/drain regions 100.

The first and second floating gates 131 and 132 may be formed on the channel region between the pair of source/drain regions 100. The first and second floating gate electrodes 131 and 132 may be electrically insulated from each other and formed symmetrical to each other with respect to the center part of the channel region. Because the first and second floating gate electrodes 131 and 132 are electrically insulated from each other as described above, they may store different data values. Hence, multi-bit data that may be stored in a unit cell may be programmed. However, example embodiments are not limited thereto. In an example embodiment, the first and second floating gate electrodes 131 and 132 may be electrically connected or integrated.

The first and second floating gate electrodes 131 and 132 may be shaped like, for example, spacers (or fins), which may be widely used in semiconductor devices. For example, as illustrated in FIG. 1, each of outer side surfaces of the first and second floating gate electrodes 131 and 132 may be perpendicular to an upper surface of the semiconductor substrate 100, and each of inner side surfaces of the first and second floating gate electrodes 131 and 132 may gradually slope with increasing width from an upper end to a lower end (e.g., gradually curved). Because the upper ends of the first and second floating gate electrodes 131 and 132 may be shaped like sharp, acute-angled tips, an electric field may be concentrated on the upper ends of the first and second floating gate electrodes 131 and 132. Consequently, operation speed may be increased and the driving voltage may be reduced during a data erasing operation.

The first and second floating gate electrodes 131 and 132 may be formed of conductive materials, for example, polysilicon doped with n-type or p-type impurities or metal.

The control gate electrode 152 may be formed on the first and second floating gate electrodes 131 and 132. The control gate electrode 152 may be formed of one or more conductive films. For example, conductive films that may be applicable to the control gate electrode 152 may include polysilicon films doped with n-type or p-type impurities, metal films, and metal silicide films.

The control gate electrode 152 may contact a portion of each of the outer side surfaces, the upper tips, and/or the inner side surfaces of the first and second floating gate electrodes 131 and 132.

The control gate electrode 152 may include a line body 152a and three legs 152b, 152c, 152d extending downward from the line body 152a. For example, the control gate electrode 152 may be E-shaped. A first leg 152b that may extend from an edge of the line body 152a may contact a portion of the outer side surface of the first floating gate electrode 131, and a second leg 152c that may extend from the other edge of the line body 152a may contact a portion of the outer side surface of the second floating gate electrode 132. In addition, a third leg 152d that may extend from the center of the line body 152 may contact the inner side surfaces of the first and second floating gate electrodes 131 and 132. A lower end of the third leg 152d may face the center part of the channel region of the semiconductor substrate 100. The upper tips of the first and second floating gate electrodes 131 and 132 may be surrounded by the first and third legs 152b and 152d and the second and third legs 152c and 152d, respectively.

The first and second legs 152b and 152c may have substantially identical lengths. However, the third leg 152d may be longer than the first and second legs 152b and 152c. In addition, while the first and second legs 152b and 152c may be formed to be perpendicular to the semiconductor substrate 100, the third leg 152d may be formed to gradually curve along with the sloping shapes of the inner side surfaces of the first and second floating gate electrodes 131 and 132.

The structure of the control gate electrode 152 and the first and second floating gate electrodes may secure an increased opposing area between the control gate electrode 152 and the first and second floating gate electrodes 131 and 132. For example, a conventional control gate electrode may face the upper surfaces of a first and/or second floating gate electrode 131 and 132. In an example embodiment, the opposing area between the control gate electrode 152 and the first and second floating gate electrodes 131 and 132 may be increased because the control gate electrode 152 may face the gradually sloped inner side surfaces of the first and second floating gate electrodes 131 and 132 and the perpendicular outer side surfaces of the first and second floating gate electrodes 131 and 132. Therefore, it may be understood that capacitance between the control gate electrode 152 and the first and second floating gate electrodes 131 and 132 may be increased. Furthermore, an increase in the capacitance may improve operating characteristics of the nonvolatile memory device. For example, because the first and second floating gate electrodes 131 and 132 may increase an induced voltage coupling effect, the driving voltage applied to the control gate electrode 152 may be reduced.

The degree to which the capacitance may be increased may be controlled by the lengths of the first and second legs 152b and 152c. For example, because the third leg 152d may face the entire inner side surfaces of the first and second floating gate electrodes 131 and 132, there may not be much margin for adjusting the opposing area. However, because the first and second legs 152b and 152c may face portions of the outer side surfaces of the first and second floating gate electrodes 131 and 132, respectively, there may be a greater margin for adjusting the opposing area. Accordingly, the lengths of the first and second legs 152b and 152c may vary according to a designed capacitance value.

At least one insulating film may be interposed between the semiconductor substrate 100, the first and second floating gate electrodes 131 and 132, and/or the control gate electrode 152.

A first gate insulating film 122 may be interposed between the channel region of the semiconductor substrate 100 and the first and second floating gate electrodes 131 and 132. The first gate insulating film 122 may be, for example, a silicon oxide film.

A second gate insulating film 140 may be interposed between the first and second floating gate electrodes 131 and 132 and the control gate electrode 152 and between the lower end of the third leg 152d of the control gate electrode 152 and the channel region of the semiconductor substrate 100 which faces the lower end of the third leg 152d. The second gate insulating film 140 may be, for example, a silicon oxide film.

Each of the first and second gate insulating films 122 and 140 may have a thickness of approximately 50-150 Å. The first and second gate insulating films 122 and 140 may have an equal thickness.

An inter-layer insulating film 118 may be interposed between the semiconductor substrate 100 and the control gate electrode 152. For example, the inter-layer insulating film 118 may be disposed between the source/drain regions 102 of the semiconductor substrate 100 and the lower ends of the first and second legs 152b and 152c of the control gate electrode 152. Thus, an upper surface of the inter-layer insulating film 118 may be at a lower height than the upper ends of the first and second floating gate electrodes 131 and 132. The inter-layer insulating film 118 may have a height equal to the distance between the semiconductor substrate 100 and the lower ends of the first and second legs 152b and 152c of the control gate electrode 152. The inter-layer insulating film 118 may be, for example, a silicon oxide film.

The outer side surfaces of the inter-layer insulating film 118 may be aligned with those of the control gate electrode 152. However, example embodiments are not limited thereto. For example, the inter-layer insulating film 118 may protrude further than the outer side surfaces of control gate electrode 152, extend beyond both the outer and inner side surfaces of the control gate electrode 152, or may be recessed further inward than the outer and/or inner side surfaces of the control gate electrode 152. An additional inter-layer insulating film (not shown) may cover the upper surface of the nonvolatile memory device.

Furthermore, the example embodiments include a nonvolatile memory device that may include contact holes, a contact plug, and/or other wirings formed in the inter-layer insulating film 118 or the additional inter-layer insulating film. The above structures are widely known in the art and will not be described in detail to avoid ambiguous interpretation of the example embodiments.

According to example embodiments, a nonvolatile memory device may be operated according to a method as described below.

If the nonvolatile memory device performs a data programming operation, a higher voltage may be applied to the control gate electrode 152. As a result, a coupling voltage may be applied to the first and second floating gate electrodes 131 and 132. If the opposing areas between the control gate electrode 152 and the first and second floating gate electrodes 131 and 132 are larger, the capacitances between them may also be higher. As a result, a voltage coupling effect may be increased. For example, a sufficiently large coupling voltage may be induced to the first and second floating gate electrodes 131 and 132.

If voltages applied to the control gate electrode 152 and the first and second floating gate electrodes 131 and 132, respectively, are greater than a threshold voltage, a channel may be formed in the semiconductor substrate 100. For example, the channel region may be turned on.

If different voltages are applied to the source/drain regions 102 on both sides of the channel region, an electric field may be formed along the turned-on channel region and electrons may flow in an opposite direction to the electric field. If the flowing electrons are energized (e.g., through acceleration, collisions with other atoms, and/or other causes), the electrons may be injected into an adjacent floating gate electrode (e.g., the first or second floating gate electrode 131 or 132) by channel hot electron injection (CHEI). For example, data may be programmed. If the direction of the electric field formed between the source/drain regions 102 is changed, the floating gate electrode into which the electrons are injected may also be changed, thus multi-bit data programming may be enabled.

If the nonvolatile memory device performs a data erasing operation, a ground voltage may be applied to both of the source/drain regions 102, and a higher voltage may be applied to the control gate electrode 152. An electric field may be formed in a direction from the control gate electrode 152 toward the first and second floating gate electrodes 131 and 132. If a voltage applied to the control gate electrode 152 is sufficiently high, the electrons injected into the first floating gate electrode 131 and/or the second floating gate electrode 132 may be moved toward the control gate electrode 152 via the second gate insulating film 140 by Fowler-Nordheim (F-N) tunneling. For example, data may be erased. Because the upper ends of the first and second floating gate electrodes 131 and 132 may have sharp tips, the electric field may be concentrated on the upper ends of the first and second floating gate electrodes 131 and 132. Accordingly, the voltage required for the F-N tunneling may be reduced, which, in turn, may reduce the driving voltage required for the data erasing operation.

FIGS. 2 through 11 are cross-sectional views of a method of fabricating a nonvolatile memory device according to an example embodiment.

Figure 2:
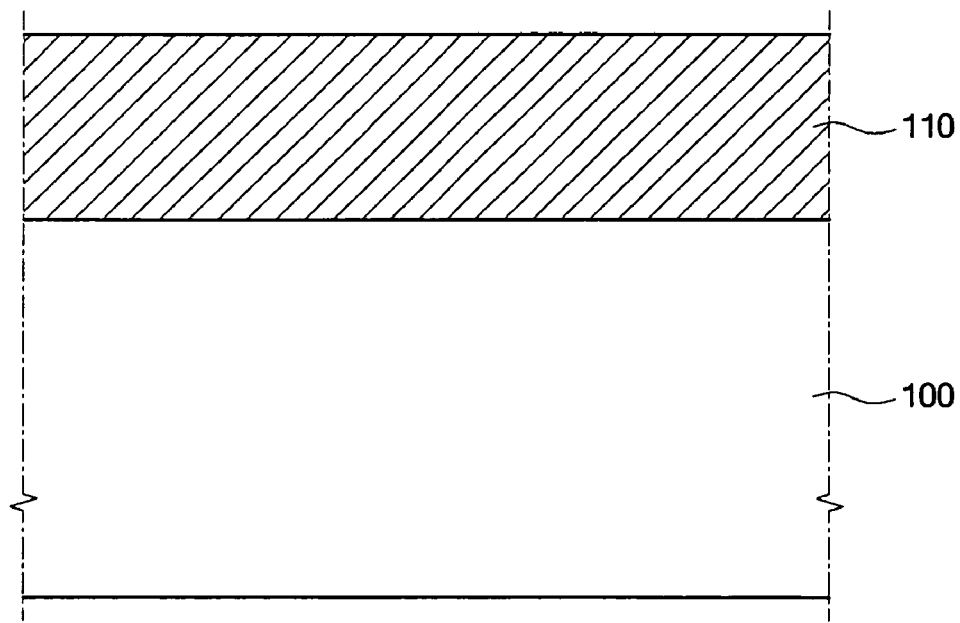
FIGS. 2 through 11 are cross-sectional views of a method of fabricating a nonvolatile memory device according to an example embodiment.

Referring to FIG. 2, a first insulating film 110 for an interlayer insulating film is formed on a semiconductor substrate 100.

For example, the semiconductor substrate 100 may be formed of at least one of Si, Ge, SiGe, GaP, GaAs, SiC, SiGeC, InAs and InP.

For example, the first insulating film 110 may be formed of an oxide film-based material, for example, a silicon oxide film. The first insulating film 110 may be formed by, for example, chemical vapor deposition (CVD), low pressure chemical vapor deposition (LPCVD), or plasma enhanced chemical vapor deposition (PECVD).

Figure 3:
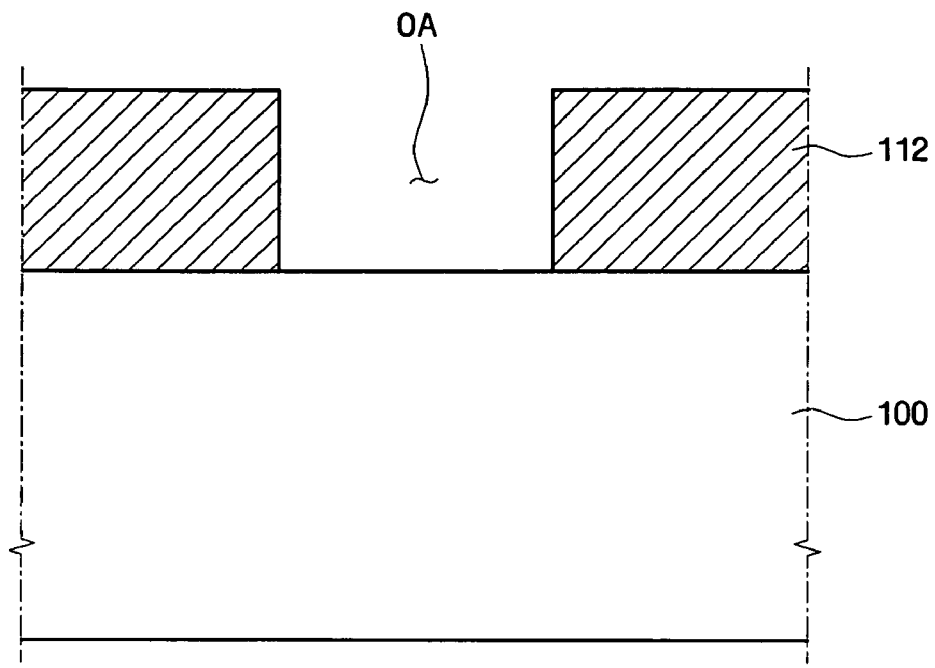

Referring to FIG. 3, the first insulating film 110 may be patterned to form an opening OA. The opening OA may define regions where floating gate electrodes may be formed and may expose a surface of the semiconductor substrate 100. The first insulating film 110 may be patterned using a photolithography process. For example, a material for an etch mask (e.g., a photoresist) may be coated on the first insulating film 110, and the coated material may be exposed and developed to form a photoresist pattern. The coated material may be dry-etched using the photoresist pattern as an etch mask. Thus, a first insulating film 112 having the opening OA is formed.

Figure 4:
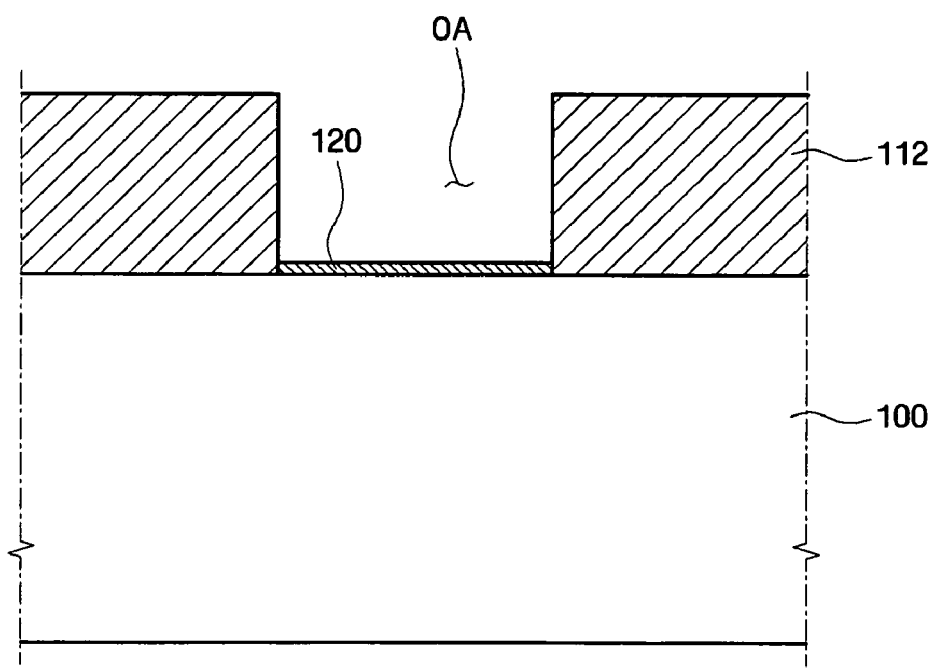

Referring to FIG. 4, a second insulating film 120 may be formed on the surface of the semiconductor substrate 100 exposed by the opening OA. For example, the second insulating film 120 may be a silicon oxide film. For example, the second insulating film 120 may be formed and then patterned using the same method as for the first insulating film 110 or may be formed by selectively oxidizing the exposed surface of the semiconductor surface 100 using a thermal oxidation process.

Figure 5:
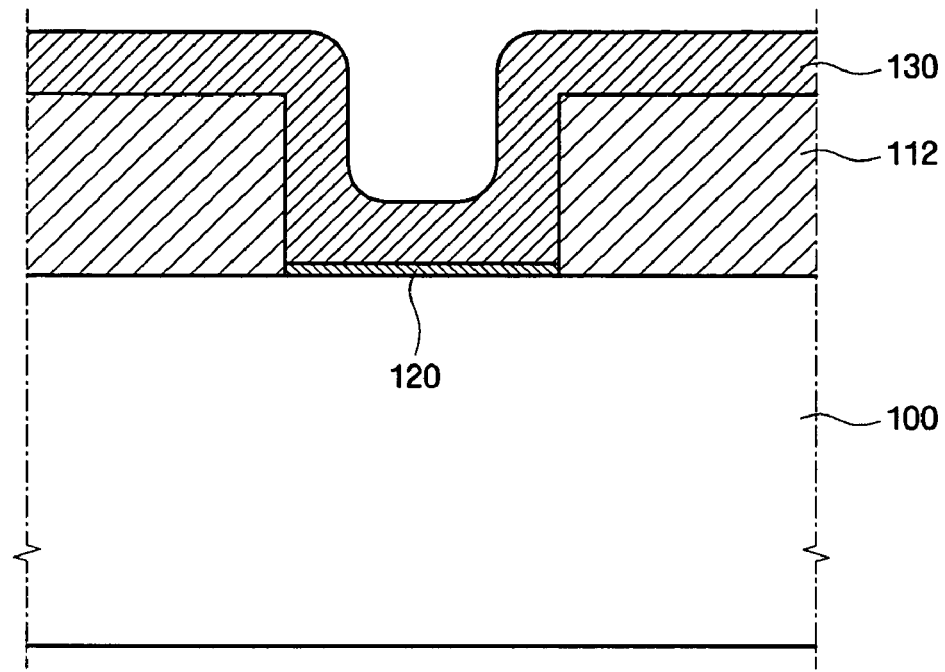

Referring to FIG. 5, a conductive film 130 for a floating gate electrode may be formed on an entire surface of the resultant structure of FIG. 4. For example, the conductive film 130 may be formed of polysilicon or metal doped with n-type or p-type impurities and may be formed by LPCVD, atomic layer deposition (ALD), physical vapor deposition (PVD), or metal organic CVD (MOCVD).

Figure 6:
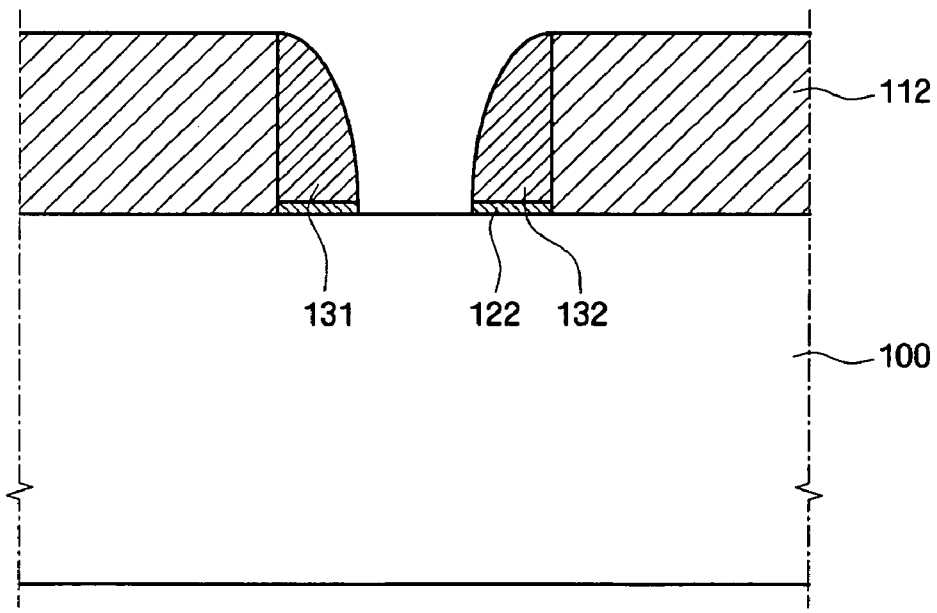

Referring to FIG. 6, the conductive film 130 may be etched back to form first and second floating gate electrodes 131 and 132 on sidewalls of the first insulating film 112. For example, the first and second floating gate electrodes 131 and 132 formed using an etch-back process may be shaped like spacers (or fins), which are widely used in semiconductor devices, for example, the spacers described above with reference to FIG. 1.

In this process, the conductive film 130 on the first insulating film 112 may be completely removed, thereby exposing a surface of the first insulating film 112. A portion of the second insulating film 120 between the first and second floating gate electrodes 131 and 132 may be removed to expose the surface of the semiconductor substrate 100. As a result, the second insulating film 120 may be divided, and a first gate insulating film 122 that may be interposed between the first floating gate electrode 131 and the semiconductor substrate 100 and between the second floating gate electrode 132 and the semiconductor substrate 100 may be completed.

For example, the first and second floating gate electrodes 131 and 132 and the first gate insulating film 122 may be formed in the etch-back process using one etching gas. Alternatively, for example, the second insulating film 120 may be exposed, and the first and second floating gate electrodes 131 and 132 and the first gate insulating film 122 may be formed using an etching gas having a higher selection ratio than for etching the second insulating film 120.

Figure 7:
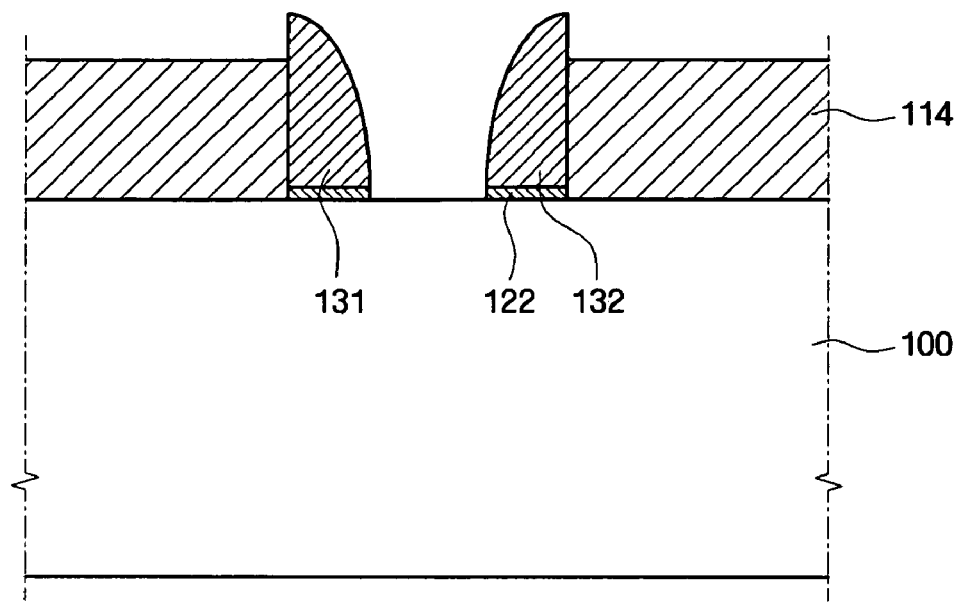

Referring to FIG. 7, the first insulating film 112 may be etched back so that an upper surface of a first insulating film 114 may be at a lower height than upper ends of the first and second floating gate electrodes 131 and 132. In FIG. 6, while inner side surfaces of the first and second floating gate electrodes 131 and 132 may be exposed, outer side surfaces of the first and second floating gate electrodes 131 and 132 may still be covered by the first insulating film 112. In FIG. 7, the outer side surfaces of the first and second floating gate electrodes 131 and 132 may be partially exposed by partially removing the first insulating film 112. The degree to which the outer side surfaces of the first and second floating gate electrodes 131 and 132 are exposed may be determined by the amount of capacitance desired between the first and second floating gate electrodes 131 and 132 and a control gate electrode. If the first insulating film 112 is sufficiently recessed and the outer side surfaces of the first and second floating gate electrodes 131 and 132 are already exposed in the process of FIG. 6, the process of FIG. 7 may be omitted.

In an example embodiment, the second insulating film 120 may not be divided as shown in FIG. 6; instead the insulating film may be divided by the etch-back process of FIG. 7. In an example embodiment, the second insulating film 120 may not be divided as in FIG. 6 or 7, instead a region occupied by the undivided second insulating film 120 may be integrated into a second gate insulating film 140, which may be formed in a subsequent process.

Figure 8:
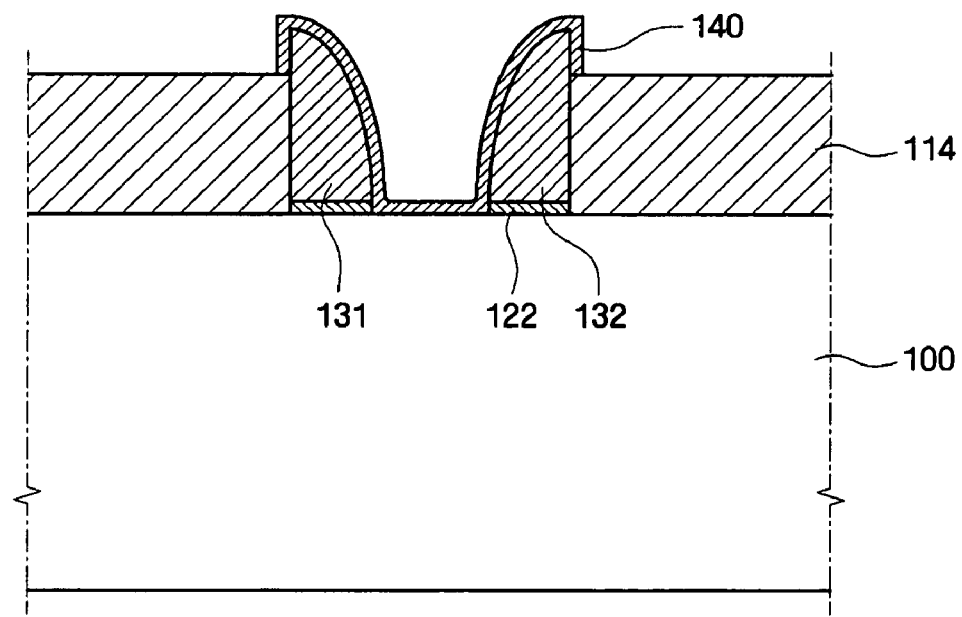

Referring to FIG. 8, a second gate insulating film 140 may be formed on surfaces of the first and second floating gate electrodes 131 and 132 and the exposed surface of the semiconductor substrate 100. For example, the second gate insulating film may be a silicon oxide film. If the first and second floating gate electrodes 131 and 132 are formed of polysilicon-based materials, the second gate insulating film 140 may be selectively formed on the surfaces of the first and second floating gate electrodes 131 and 132 and the exposed surface of the semiconductor substrate 100 using a thermal oxidation process.

Figure 9:
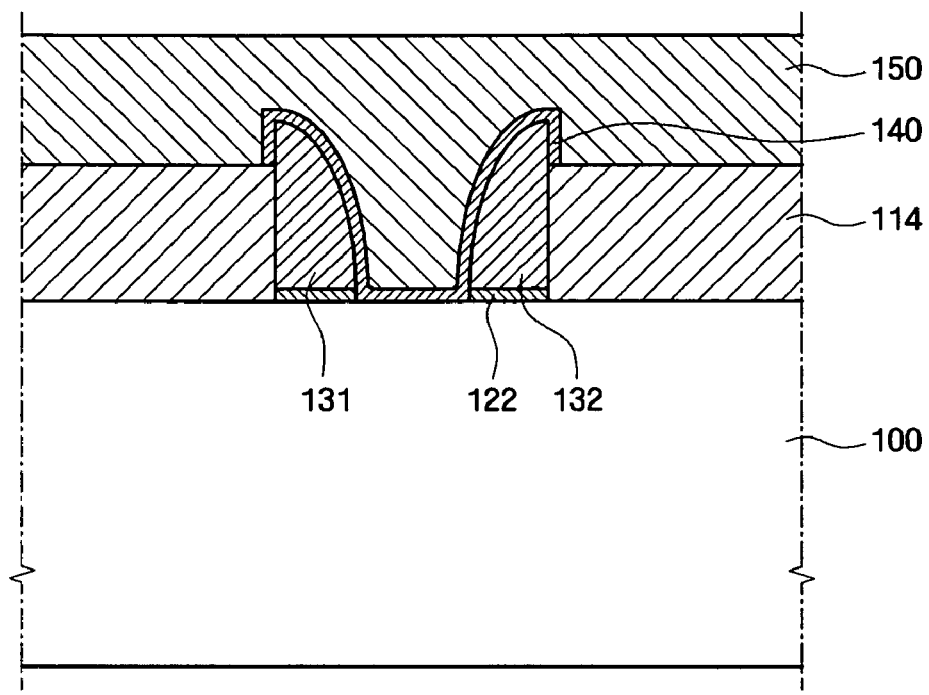

Referring to FIG. 9, a conductive film 150 may be formed on an entire surface of the resultant structure of FIG. 8. The conductive film 150 may fill or partially fill the space between the first and second floating gate electrodes 131 and 132 and may cover the outer side surfaces of the first and second floating gate electrodes 131 and 132. For example, the conductive film 150 may be formed of polysilicon or metal doped with n-type or p-type impurities and may be formed by LPCVD, ALD, PVD, or MOCVD.

Figure 10:
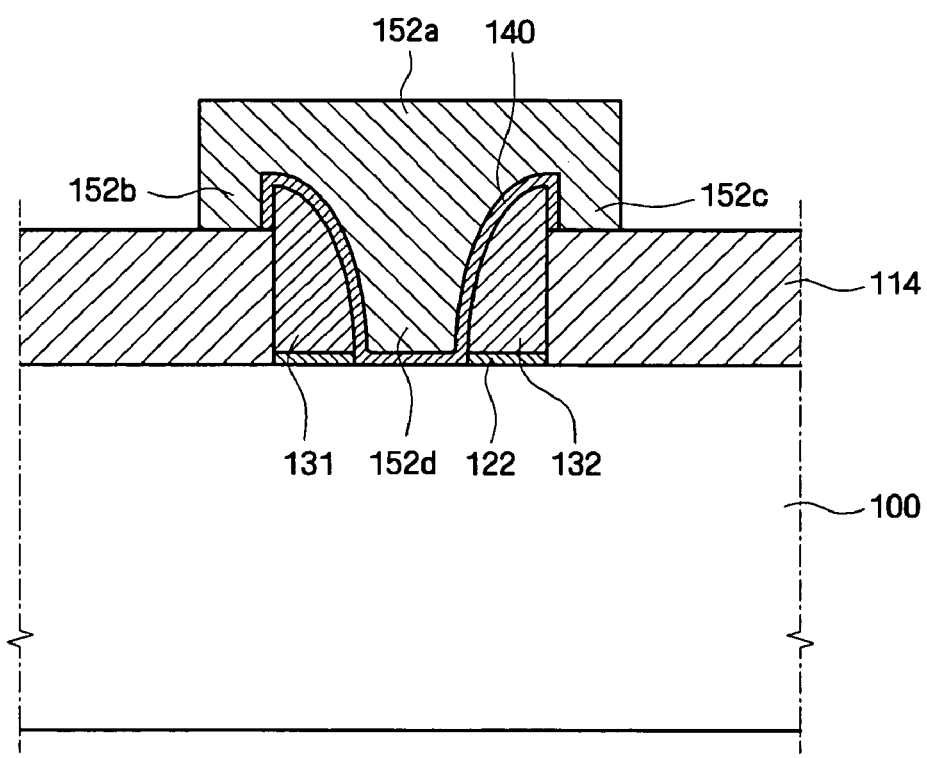

Referring to FIG. 10, the conductive film 150 may be patterned to form a control gate electrode 152 that may include a line body 152*a* and a first leg, second leg and third leg 152*b*, 152*c*, 152*d* extending downward from the line body 152*a*. For example, the conductive film 150 may be patterned using a photolithography process. Because specific methods of the photolithography process are widely known in the art, a detailed description thereof will be omitted. As a result of patterning the conductive film 150, the first insulating film 114 under the conductive film 150 may be partially exposed.

Figure 11:
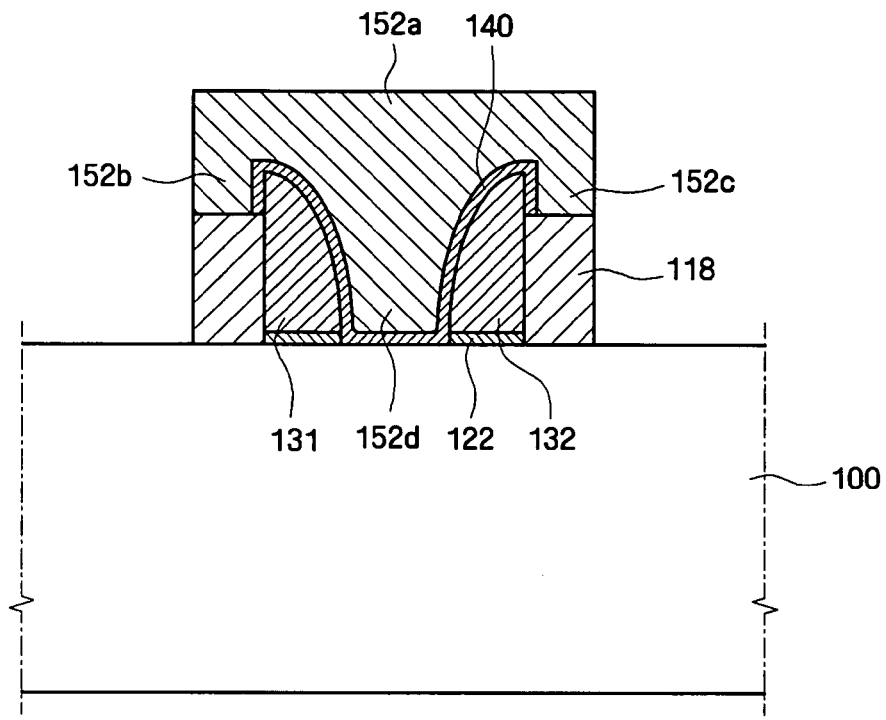

Referring to FIG. 11, the exposed first insulating film 114 may be etched and may use the control gate electrode 152 as an etch mask. An inter-layer insulating film 118 may be interposed between respective lower ends of the first and second legs 152*b* and 152*c* of the control gate electrode 152 to complete the semiconductor substrate 100.

If the first insulating film 114 is anisotropically etched, the control gate electrode 152 may be used as an etch mask and the outer side surfaces of the inter-layer insulating film 118 may be aligned with the outer surfaces of the control gate electrode 152. If the first insulating film 114 is isotropically etched, the outer side surfaces of the inter-layer insulating film 118 may be recessed from the outer side surfaces of the control gate electrode 152. Furthermore, the etching process may be omitted and the inter-layer insulating film 114 may protrude beyond the outer sides of the control gate electrode 152.

N-type or p-type impurities may be doped into portions of the semiconductor substrate 100 located beyond the outer side surfaces of the first and second floating gate electrodes 131 and 132 to form source/drain regions 102, as shown in FIG. 2.

FIGS. 12 through 15 are cross-sectional views for of a method of fabricating a nonvolatile memory device according to an example embodiment. Descriptions of identical processes and elements described above with reference to FIGS. 2 through 11 will be omitted or simplified.

Figure 12:
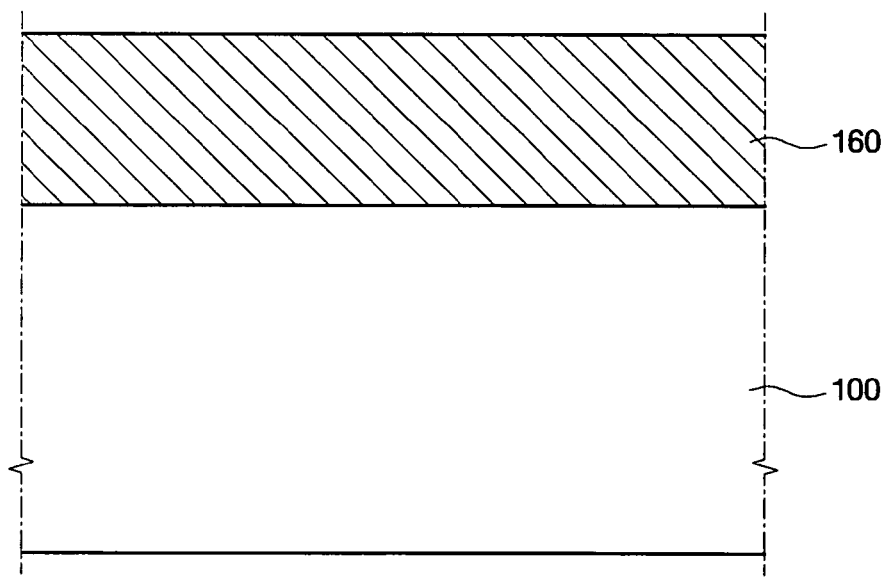
FIGS. 12 through 15 are cross-sectional views of a method of fabricating a nonvolatile memory device according to an example embodiment.

Referring to FIG. 12, a third insulating film 160 may be formed on a semiconductor substrate 100. The third insulating film 160 may be formed of a material having a higher etching selection ratio than for an inter-layer insulating film 118, which may be formed in a subsequent process. For example, the third insulating film 160 may be formed by CVD, LPCVD, or PECVD.

Figure 13:
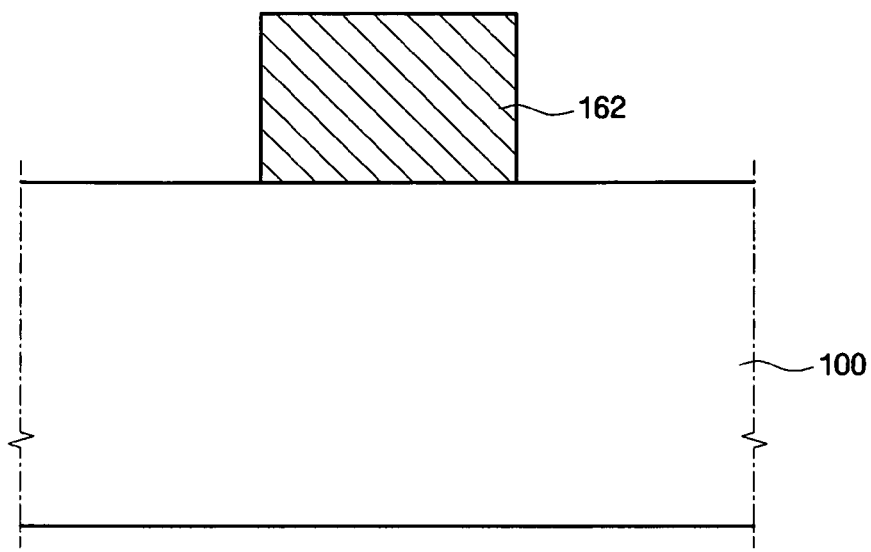

Referring to FIG. 13, the third insulating film 160 may be patterned to form a sacrificial insulating film 162. For example, the third insulating film 160 may be patterned using a photolithography process. The sacrificial insulating film 162 may be patterned to correspond to an opening of an inter-layer insulating film 118, which may be formed in a subsequent process.

Figure 14:
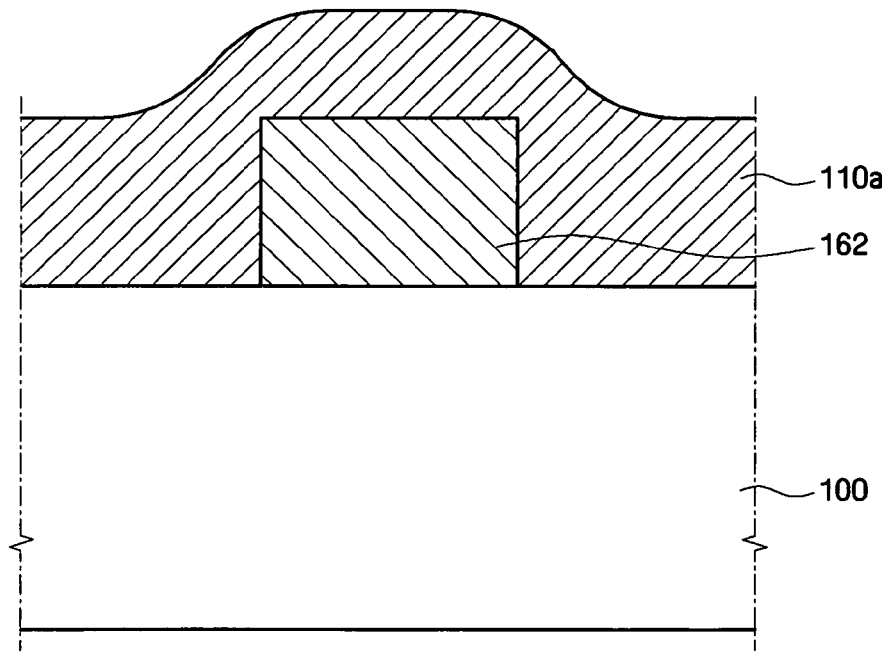

Referring to FIG. 14, a first insulating film 110*a* for an inter-layer insulating film may be formed on an entire surface of the resultant structure of FIG. 13. For example, the first insulating film 110*a* may be formed of a material identical to that of the first insulating film 110 described above with reference to FIG. 2 and may be formed using the same method as for the first insulating film 110 of FIG. 2.

Figure 15:
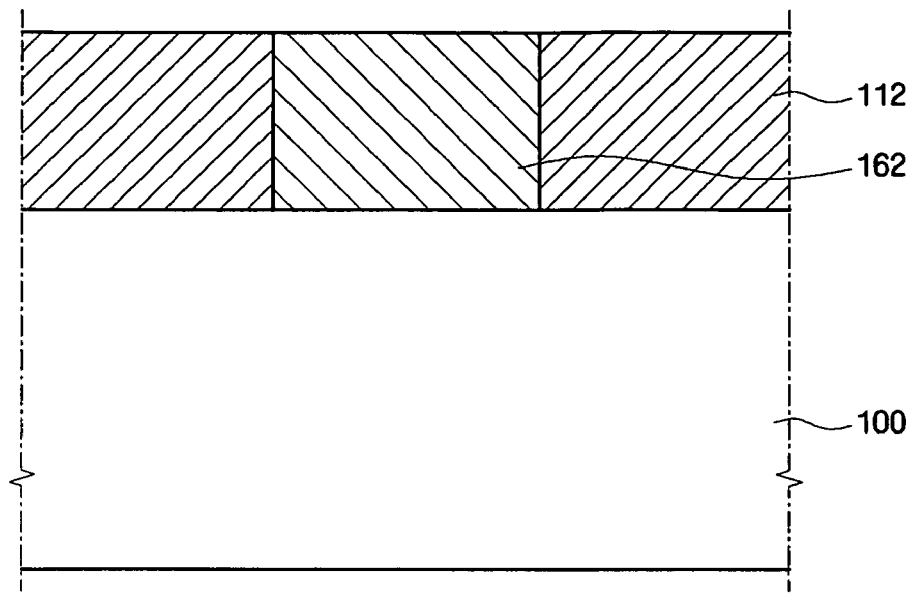

Referring to FIG. 15, the first insulating film 110*a* may be planarized to expose a surface of the sacrificial insulating film 162. For example, the first insulating film 110*a* may be planarized using a chemical mechanical polishing (CMP) or etch-back process. If the CMP process is used, the sacrificial insulating film 162 may be used as a polish stopper.

For example, the exposed sacrificial insulating film 162 may be removed by wet etching, which may be isotropic etching. In a conventional patterning process, a pattern profile may have an unwanted shape, for example, a tapered shape. However, in an example embodiment, because a pattern of the first insulating film 112 may be formed longitudinally, wet etching may have little or no effect on the pattern profile of the first insulating film 112.

The sacrificial insulating film 162 may be removed, and an opening OA may be formed in the first insulating film 112 as illustrated in FIG. 3. Wet etching may have less of an effect on a lower structure (e.g., the semiconductor substrate 100) than dry etching. Therefore, if the opening OA is formed by wet etching, etching on the semiconductor substrate 100 (a channel region may be formed in the semiconductor substrate 100 in a subsequent process) under the opening OA may be reduced and/or prevented. Subsequent processes may be performed as described above with reference to FIGS. 3 through 11.

FIGS. 16 through 25 are cross-sectional views of a method of fabricating a nonvolatile memory device according to an example embodiment. Descriptions of identical processes and elements described above with reference to FIGS. 2 through 11 will be omitted or simplified.

Figure 16:
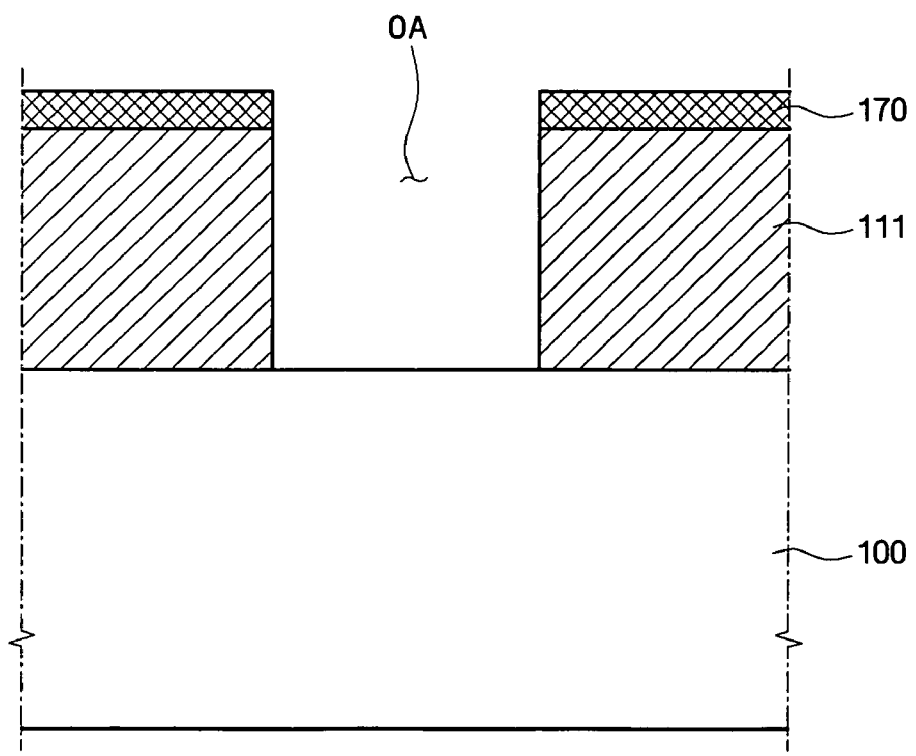
FIGS. 16 through 25 are cross-sectional views of a method of fabricating a nonvolatile memory device according to an example embodiment.

Referring to FIG. 16, a first insulating film 111 and a fourth insulating film 170 may be sequentially formed on a semiconductor substrate 100.

The first insulating film 111 may be substantially identical to the first insulating film 110 described above with reference to FIG. 2. However, the first insulating film 111 may be thicker than the first insulating film 110 of FIG. 2.

The fourth insulating film 170 may be formed of a material having a higher etching selection ratio than the first insulating film 111. For example, if the first insulating film 111 is a silicon oxide film, the fourth insulating film 170 may be a silicon nitride film.

The first insulating film 111 and the fourth insulating film 170 may be formed in the same method as for the first insulating film 110 described above with reference to FIG. 2.

The fourth insulating film 170 and the first insulating film 111 may be patterned to form an opening OA. The fourth insulating film 170 and the first insulating film 111 may be pattered using a photolithography process.

Figure 17:
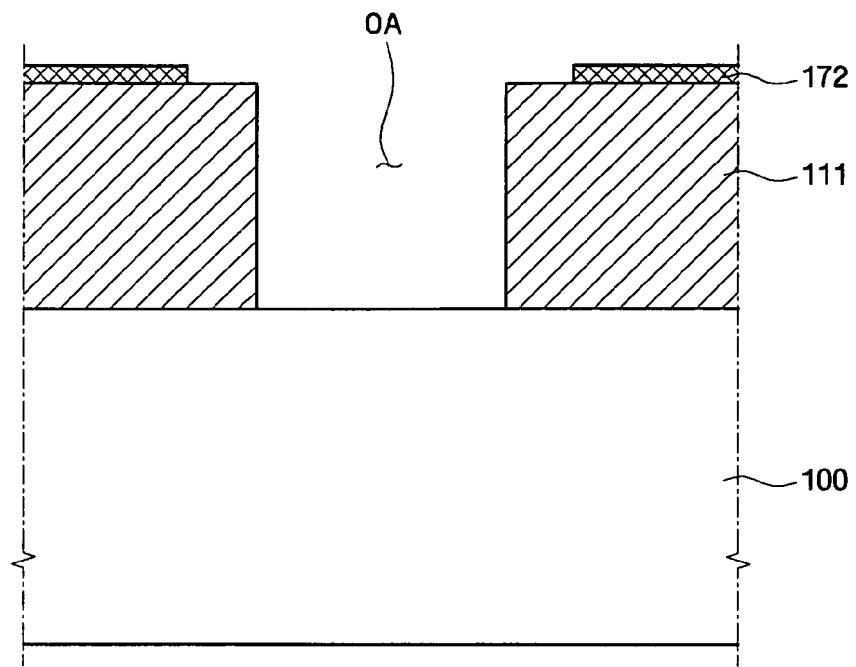

Referring to FIG. 17, the fourth insulating film 170 for the hard mask may be partially removed so that the fourth insulating film 170 may be recessed from the inner side of the first insulating film 111. For example, the fourth insulating film 170 may be partially removed in a pull-back process that may use isotropic etching, for example, wet etching. The degree to which a hard mask 172 may be recessed may determine widths of first and second legs 152*b*, 152*c* of a control gate electrode 152, which may be formed in a subsequent process. The thickness of the hard mask 172 may also be reduced.

Figure 18:
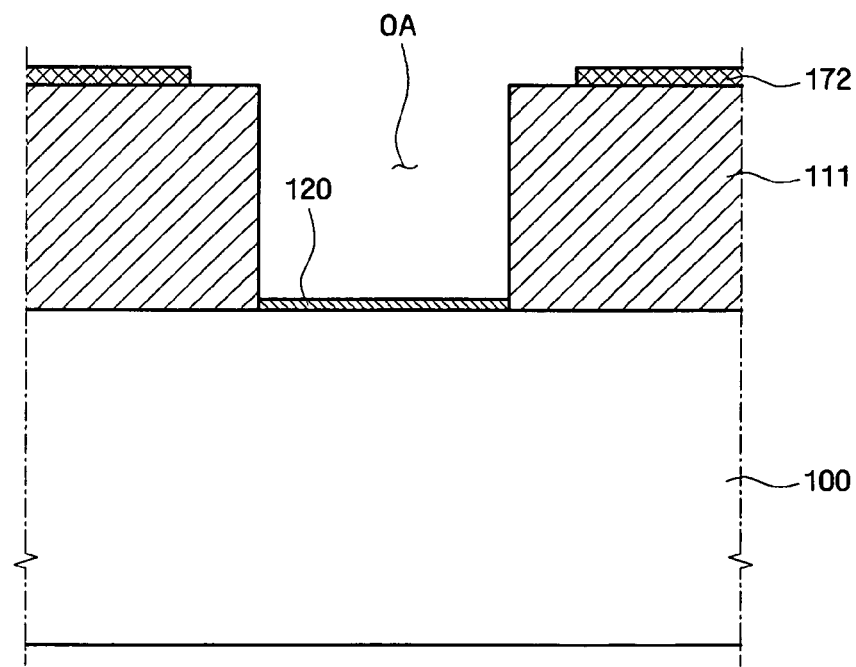

Referring to FIG. 18, a second insulating film 120 may be formed on a surface of the semiconductor substrate 100 exposed by the opening OA. For example, the second insulating film 120 may be formed in the same method described above with reference to FIG. 4.

Figure 19:
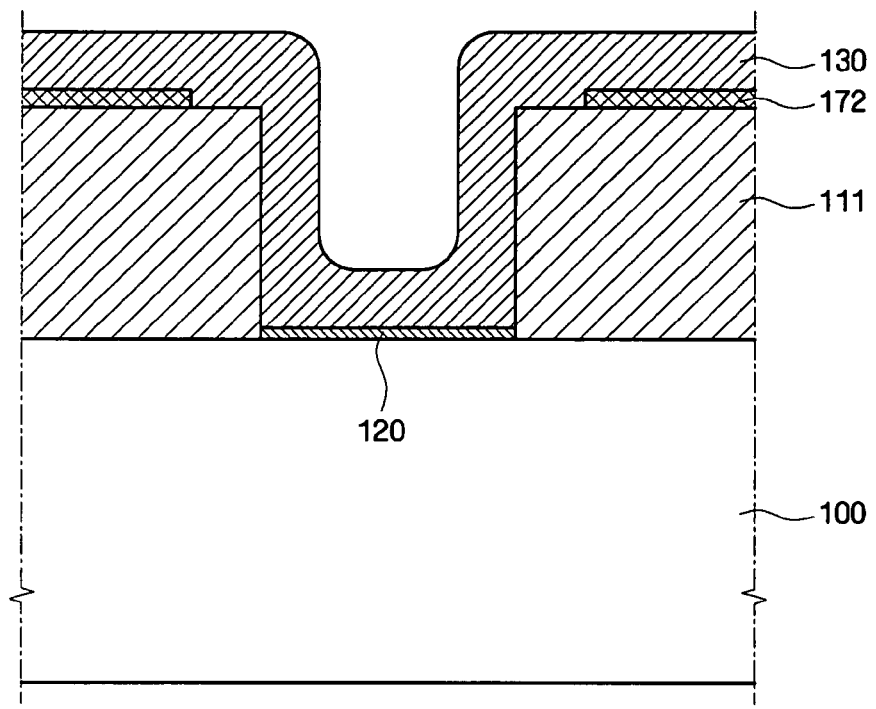

Referring to FIG. 19, a conductive film 130 may be formed on an entire surface of the result structure of FIG. 18. For example, the conductive film 130 may be formed of a material identical to that of the conductive film 130 described above with reference to FIG. 5 and formed using the same method as for the first insulating film 130 of FIG. 5.

Figure 20:
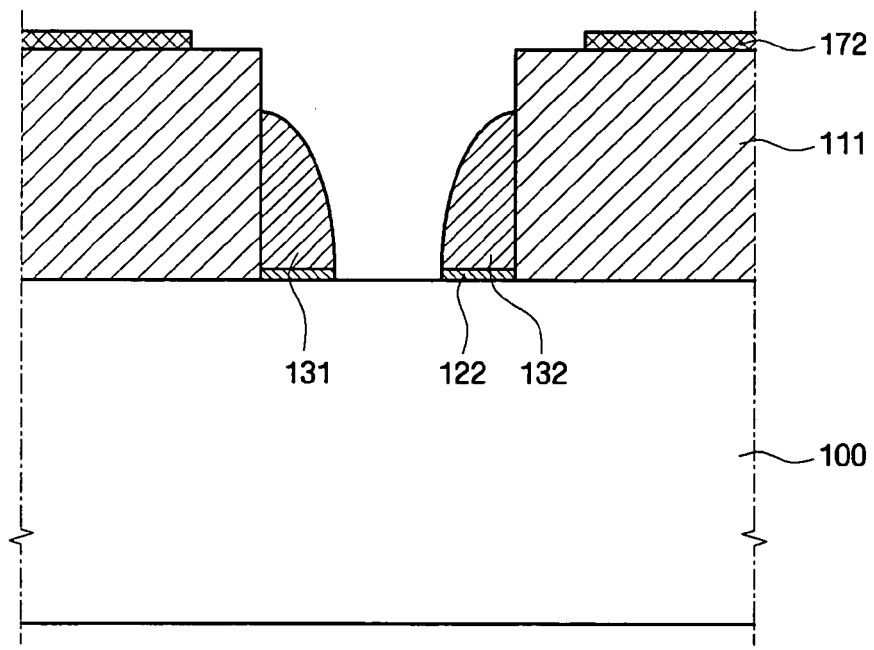

Referring to FIG. 20, the conductive film 130 may be etched back to form first and second floating gate electrodes 131 and 132 on sidewalls of the first insulating film 111. The second insulating film 120 may be etched back to form a first gate insulating film 122. The process of FIG. 20 may be substantially identical to the process of FIG. 6. However, in FIG. 20 the outer sidewalls of the first and second floating gate electrodes 131 and 132 may be recessed further downward from the inner sidewalls of the first insulating film 111 on the sides of the opening OA. For example, upper ends of the first and second floating gate electrodes 131 and 132 may be at a lower height than an upper surface of the first insulating film 111.

Figure 21:
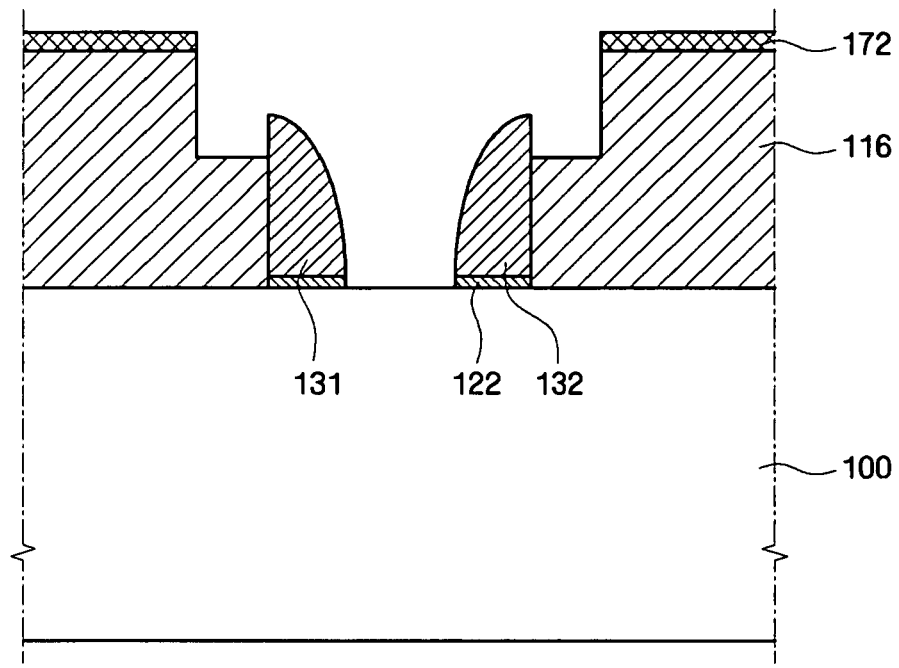

Referring to FIG. 21, portions of the first insulating film 111 uncovered by the hard mask 172 may be partially removed by dry etching. The first insulating film 111 may etched to a depth at which at least a portion of each of the outer side surfaces of the first and second floating electrodes 131 and 132 may be exposed. As described above, the capacitance between the first and second floating gate electrodes 131 and 132 and the control gate electrode 152 may vary according to an etch depth of a first insulating film 116.

Figure 22:
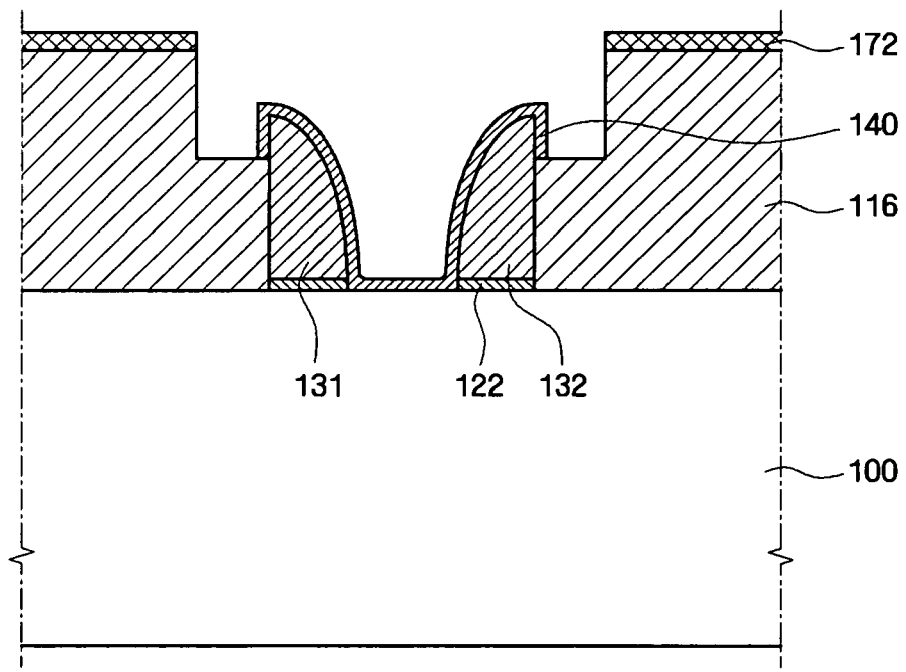

Referring to FIG. 22, a second insulating film 140 may be formed on exposed surfaces of the first and second floating gate electrodes 131 and 132 and the exposed surface of the semiconductor substrate 100, for example, using the same method described above with reference to FIG. 8.

Figure 23:
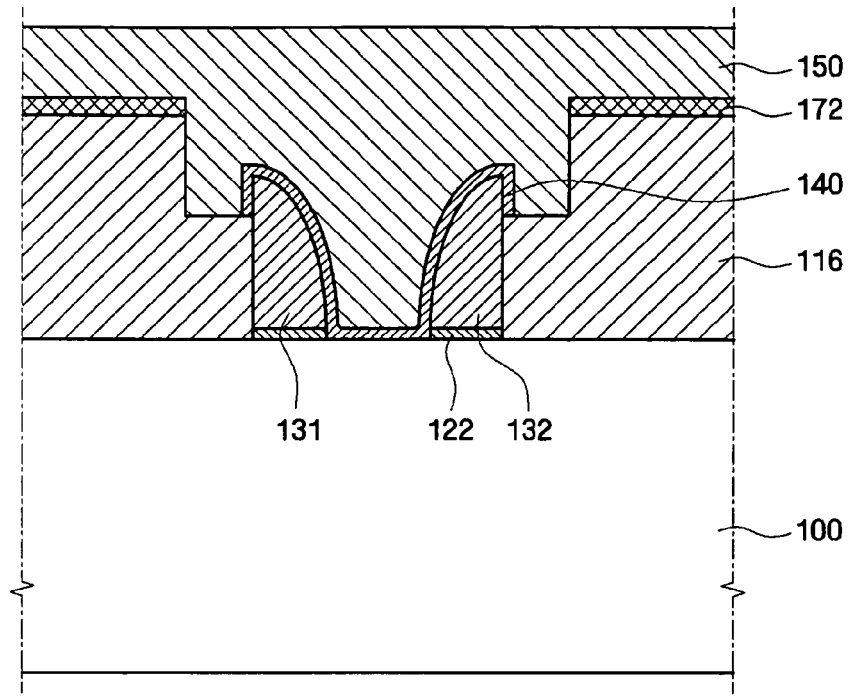

Referring to FIG. 23, a conductive film 150 for a control gate electrode may be formed on the resultant structure of FIG. 22, for example, using the same method as in the process of FIG. 9. The conductive film 150 may completely fill the opening OA surrounded by the first insulating film 116. The conductive film 150 for the control gate electrode may be formed up to a height above the hard mask 172 to secure a processing margin.

Figure 24:
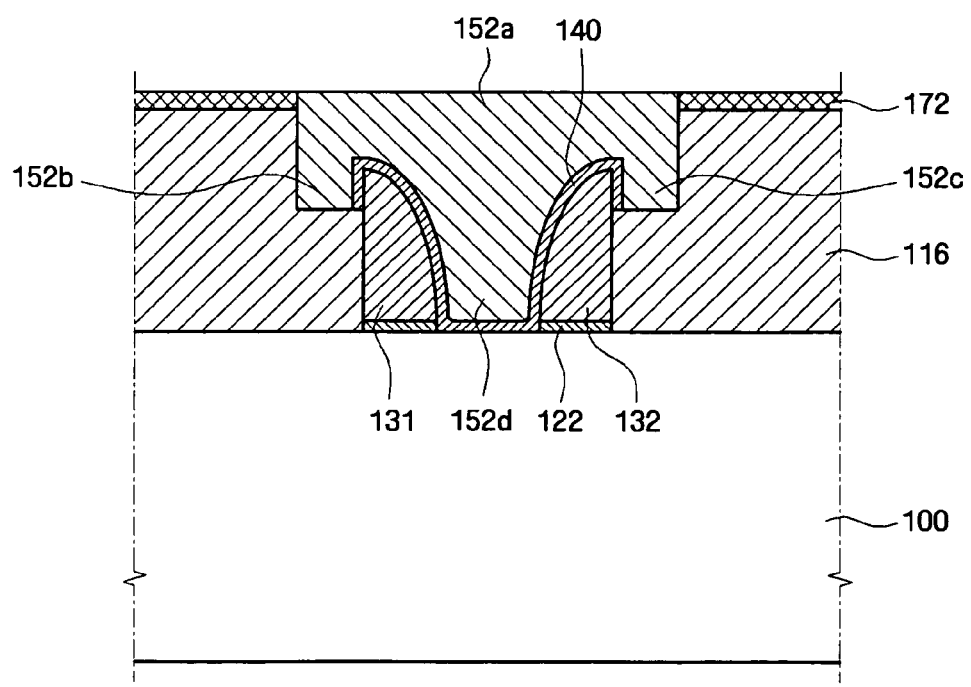

Referring to FIG. 24, the conductive film 150 may be planarized using, for example, a CMP or etch-back process, to complete the control gate electrode 152. If a CMP process is used, the hard mask 172 may be used as a polish stopper.

Because the control gate electrode 152 may be formed by self-alignment, rather than by photolithography, the probability of misalignment is reduced or prevented, which may be advantageous in terms of securing a processing margin.

Figure 25:
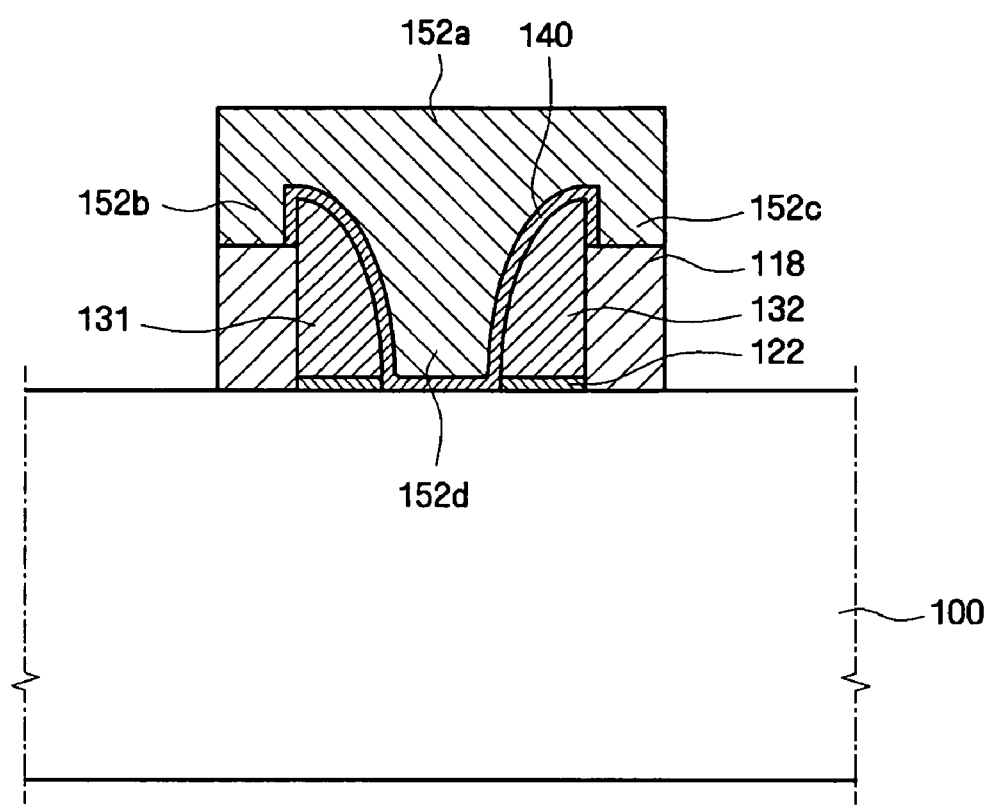

Referring to FIG. 25, the hard mask 172 and the first insulating film 116 under the hard mask 172 may be sequentially etched using the control gate electrode 152 as an etch mask. The hard mask 172 and the first insulating film 116 may be anisotropically etched, for example, dry-etched. Alternatively, the hard mask 172 may be wet-etched, and the first insulating film 116 may be dry-etched. As a result, an inter-layer film 118 may be aligned with outer sidewalls of the control gate electrode 152. However, as described above with reference to FIG. 11, the inter-layer insulating film 118 may be formed according to various example embodiments.

N-type or p-type impurities may be doped into portions of the semiconductor substrate 100 that may be located beyond the outer sides of the first and second floating gate electrodes 131 and 132 to form source/drain regions 102.

According to an example embodiment, first and second floating gate electrodes may be formed by self-alignment in a nonvolatile memory device, which may reduce the probability of misalignment. In an example embodiment, a control gate electrode may be formed by self-alignment, which may reduce the probability of misalignment. Accordingly, reliability of the nonvolatile memory device may be enhanced.

According to an example embodiment, a nonvolatile memory device may include a control gate electrode that may contact upper ends, inner side surfaces and outer side surfaces of first and second floating electrodes, thus an opposing area may be increased. Because the opposing area may be increased, the capacitance between the control gate electrode and the first and second floating electrodes may be increased. Accordingly, effective voltage coupling may occur.

While example embodiments have been shown and described, it will be understood by those of ordinary skill in the art that various changes in form and detail may be made therein without departing from the spirit and scope of the example embodiments as disclosed in the following claims. The example embodiments should be considered in descriptive sense only and not for purposes of limitation.

What is claimed is:

1. A method of fabricating a nonvolatile memory device, the method comprising:
   forming a first insulating film having an opening on a semiconductor substrate;
   forming first and second floating gate electrodes on inner side walls of the first insulating film on the sides of the opening;
   etching the first insulating film to partially expose outer side surfaces of the first and second floating gate electrodes and to partially leave the first insulating film; and
   forming a control gate electrode on the first and second floating gate electrodes, the control gate electrode including a line body and a first leg, second leg, and third leg extending vertically from the line body toward the semiconductor substrate.

2. The method of claim 1, wherein forming the control gate electrode includes forming the first leg to contact a portion of the outer side surface of the first floating gate electrode, the second leg to contact a portion of the outer side surface of the second floating gate electrode, and the third leg to contact inner side surfaces of the first and second floating gate electrodes.

3. The method of claim 1, wherein forming the control gate electrode includes forming the third leg longer than the first and second legs.

4. The method of claim 1, wherein forming the first insulating film includes:
   forming the first insulating film on an entire surface of the semiconductor substrate; and
   patterning the first insulating film to form the opening.

5. The method of claim 1, wherein forming the first insulating film includes:
   forming a second insulating film on the entire surface of the semiconductor substrate;
   patterning the second insulating film to form a sacrificial insulating film;
   forming the first insulating film on the entire surface of the semiconductor substrate and the sacrificial insulating film;
   planarizing the first insulating film and exposing the sacrificial insulating film; and
   removing the sacrificial insulating film.

6. The method of claim 1, wherein forming the first and second floating gate electrodes includes:

forming a conductive film on the entire surface of the semiconductor substrate and the first insulating film; and etching back the conductive film to form the floating gate electrode.

7. The method of claim 6, wherein each of the first and second floating gate electrodes includes an acute-angled tip on an upper end, and wherein the outer side surface of each of the first and second floating gate electrodes is perpendicular to the semiconductor substrate and the inner side surface of each of the first and second floating gate electrodes slopes with increasing width from an upper end to a lower end.

8. The method of claim 1, wherein forming the control gate electrode includes:

forming a conductive film on the entire surface of the semiconductor substrate to fill a space between the first and second floating gate electrodes and to cover the outer side surfaces of the first and second floating gate electrodes; and patterning the conductive film to form the control gate electrode.

9. The method of claim 1, further comprising:

forming a second insulating film in the opening;

patterning the second insulating film to form a first gate insulating film interposed between the semiconductor substrate and the first and second floating gate electrodes; and forming a second gate insulating film on surfaces of the first and second floating gate electrodes and an exposed surface of the semiconductor substrate between the first and second floating gate electrodes.

10. The method of claim 1, further comprising:

forming a second insulating film on the first insulating film; and partially removing the second insulating film so that the insulating film is recessed from the inner side surface of the first insulating film to form a hard mask exposing an upper surface the first insulating film, wherein forming the first and second floating gate electrodes includes forming upper ends of the first and second floating gate electrodes at a lower height than an upper surface of the first insulating film, etching the first insulating film includes etching the exposed first insulating film using the hard mask as an etch mask, and forming the control gate electrode includes forming a conductive film to completely fill the opening in the etched first insulating film and planarizing the conductive film.

11. The method of claim 10, further comprising:

etching the hard mask and the first insulating film under the hard mask using the control gate electrode as an etch mask.

12. The method of claim 1, wherein the first insulating film is partially removed by etching.

13. The method of claim 1, wherein part of the outer side surfaces of the first and second floating gates are covered by the first insulating film after the first insulating film has been partially removed.

14. The method of claim 1, wherein forming the control gate electrode on the first and second floating gate electrodes also includes forming the first and second legs of the control gate electrode on the first insulating film after the film has been partially removed.

* * * * *